United States Patent [19]

Tsutsui et al.

[11] Patent Number: 5,063,622
[45] Date of Patent: Nov. 12, 1991

[54] WATER SUPPLY CONTROL SYSTEM

[75] Inventors: Osamu Tsutsui; Takao Yoshida; Shoji Inoue, all of Kanagawa, Japan

[73] Assignee: Toto Ltd., Japan

[21] Appl. No.: 582,226

[22] PCT Filed: Feb. 7, 1990

[86] PCT No.: PCT/JP90/00149
§ 371 Date: Oct. 4, 1990
§ 102(e) Date: Oct. 4, 1990

[87] PCT Pub. No.: WO90/09491
PCT Pub. Date: Aug. 23, 1990

[30] Foreign Application Priority Data

Feb. 7, 1989 [JP] Japan .................................. 1-28029

[51] Int. Cl.$^5$ .............................................. E03C 1/05
[52] U.S. Cl. ............................................ 4/623; 4/304; 251/129.04
[58] Field of Search .................. 251/129.04, 129.05; 137/624.11; 4/304, 313, 623, DIG. 3

[56] References Cited

U.S. PATENT DOCUMENTS

| | | | |
|---|---|---|---|
| 4,309,781 | 1/1982 | Tissan | 4/623 X |
| 4,667,350 | 5/1987 | Ikenaga | 4/304 |
| 4,682,628 | 7/1987 | Hill | 251/129.04 X |
| 4,742,583 | 5/1988 | Yoshida | 4/313 |
| 4,762,273 | 8/1988 | Gregory | 251/129.04 X |

FOREIGN PATENT DOCUMENTS

| | | |
|---|---|---|
| 56-105036 | 5/1981 | Japan . |
| 58-41385 | 5/1983 | Japan . |
| 61-4077 | 3/1986 | Japan . |
| 62-156448 | 7/1987 | Japan . |
| 62-280430 | 12/1987 | Japan . |

Primary Examiner—Alan Cohan
Attorney, Agent, or Firm—Howard L. Rose

[57] ABSTRACT

A water supply control system has a faucet actuating means for actuating a water supply faucet to supply water, a light-emitting means for intermittently emitting light at at least a first period, a light-detecting means for detecting light emitted from the light-emitting means and reflected by a portion of the body of a user of the faucet, and for producing a detected signal indicative of whether the light is detected or not, and a control means for controlling the faucet actuating means to actuate the faucet based on the detected signal from the light-detecting means. The control means comprises an auxiliary light-emitting means for enabling the light-emitting means to effect a plurality of light emissions at a second period shorter than the first period, based on the detected signal from the light-detecting means, and a decision means for applying a control signal to the faucet actuating means to control the faucet based on the number of times in which the light is detected by the light-detecting means, among the light emissions caused by the auxiliary light-emitting means through the light-emitting means.

14 Claims, 14 Drawing Sheets

WATER SUPPLY CONTROL SYSTEM

TECHNICAL FIELD

The present invention relates to a water supply control system for automatically feeding water through a faucet or the like when a user is detected.

BACKGROUND ART

There are known water supply control systems for use with toilets or the like, wherein an optical means detects whether there is a user or not, and water is appropriately supplied through a faucet.

In such a water supply control system, the optical means detects a human being by energizing a light-emitting element, for example, to apply light to the human being, and detecting reflected light with a light-detecting element. If the water supply control system is powered by a battery, the light-emitting and -detecting elements are generally energized periodically (intermittently) in order to prevent quick consumption of the battery.

When the light-emitting and -detecting elements are energized intermittently, if noise is generated due to an extraneous electromagnetic wave or the like, the light-detecting element may produce a signal as if it detected a user, or light may not be well detected by the light-emitting element because of fluctuations on the part of the user. Therefore, the water supply control system is prone to malfunctions.

For the removal of such noise, the detection level of the light-detecting element may be increased higher than the level of the noise. The increased detection level of the light-detecting element, however, results in a reduction in the actual sensitivity with which users can be detected.

DISCLOSURE OF THE INVENTION

The present invention has been made in an effort to solve the aforesaid conventional problems.

It is an object of the present invention to provide a water supply control system which is less susceptible to noise, does not have a reduced sensitivity, and is highly reliable.

According to the present invention, a water supply control system comprises a faucet actuating means for actuating a water supply faucet to supply water, a light-emitting means for intermittently emitting light at least a first period, a light-detecting means for detecting light emitted from the light-emitting means and reflected by a portion of the body of a user of the faucet, and for producing a detected signal indicative of whether the light is detected or not, and a control means for controlling the faucet actuating means to actuate the faucet based on the detected signal from the light-detecting means, the control means comprising an auxiliary light-emitting means for enabling the light-emitting means to effect a plurality of light emissions at a second period shorter than the first period, based on the detected signal from the light-detecting means; and a decision means for applying a control signal to the faucet actuating means to control the faucet based on the number of times in which the light is detected by the light-detecting means, among the light emissions caused by the auxiliary light-emitting means through the light-emitting means.

BEST MODE FOR CARRYING OUT THE INVENTION

A water supply control system according to a first embodiment of the present invention will hereinafter be described in detail with reference to the accompanying drawings.

The water supply control system according to the first embodiment can primarily be incorporated in an automatic flushing device for a toilet or the like in a bathroom. When a user leaves the toilet after the user has been detected, the water supply control system automatically feeds or supplies water to the toilet through a faucet.

Figure 1:
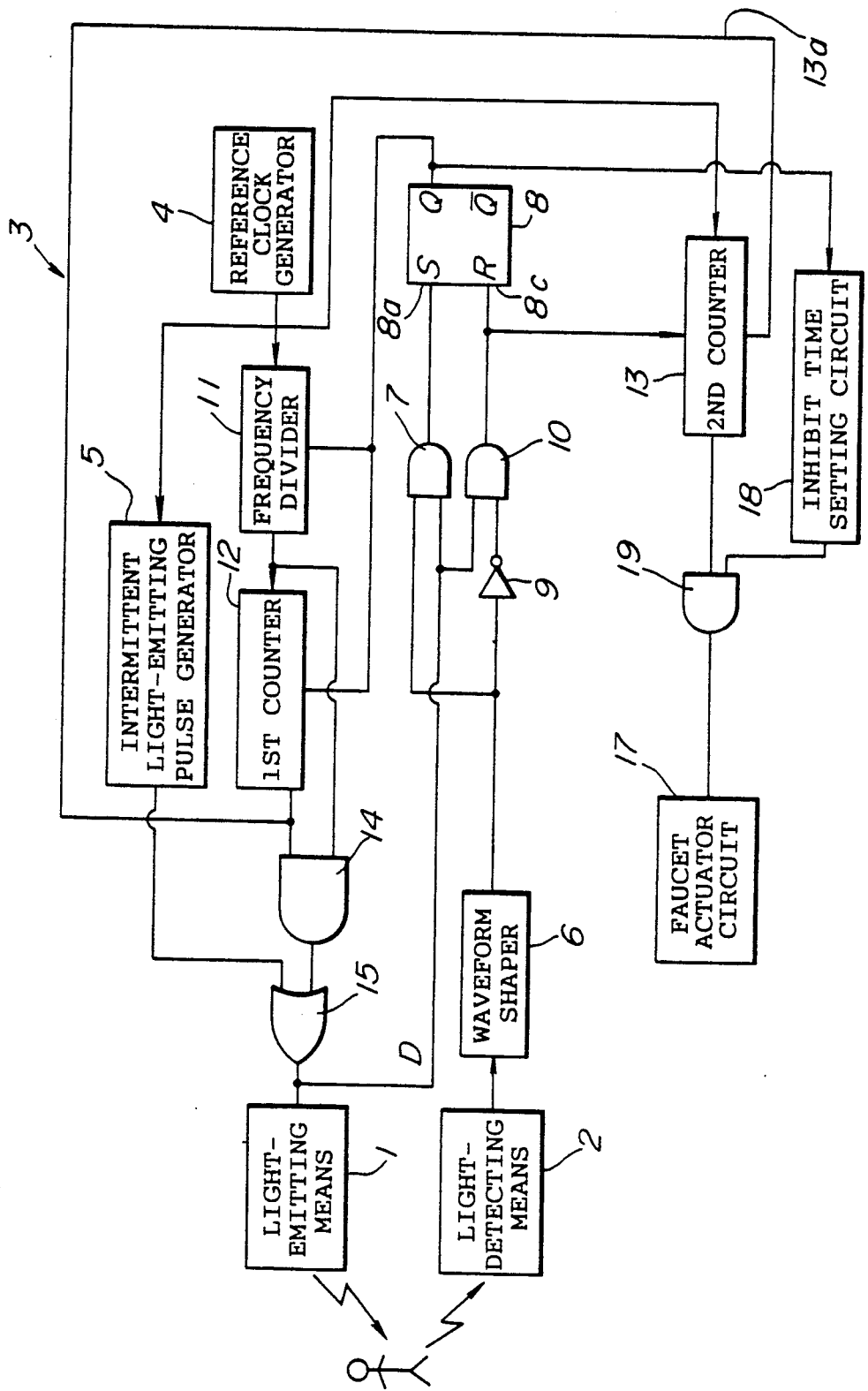
FIG. 1 is a block diagram of a circuit arrangement of a water supply control system according to a first embodiment of the present invention.

FIG. 1 shows in block form a circuit arrangement of the water supply control system according to the first embodiment. In FIG. 1, the water supply control system comprises a light-emitting means 1 such as a photodiode or the like, a light-detecting means 2 such as a phototransistor or the like for detecting light emitted from the light-emitting means 1 and reflected by a portion of the body of a user, a faucet actuator circuit 17 for actuating a faucet (not shown) to supply water to a toilet or the like after the it has been used by the user, and a control means 3.

Normally, the light-emitting means 1 is energized by an intermittent light-emitting pulse generator 5 which frequency-divides a clock signal produced by a reference clock generator 4 to generate pulses at suitable periods. Output pulses of the intermittent light emitting pulse generator 5 are shown in FIG. 2(b).

Figure 2:
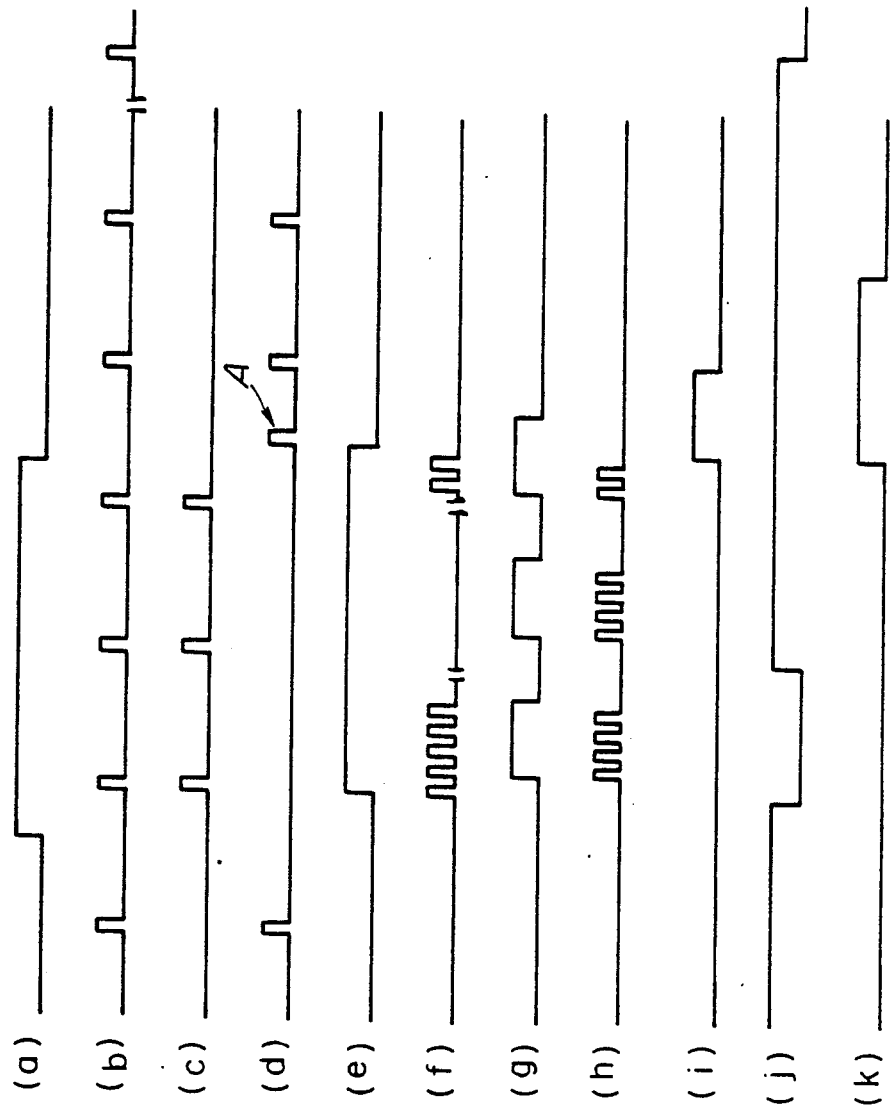
FIG. 2 is a timing chart of operation of the circuit arrangement shown in FIG. 1.

When a portion of the body of the user approaches the light-emitting means 1, the light-detecting means 2 applies its detected signal to a waveform shaper 6, which then produces a pulse signal shown in FIG. 2(c). FIG. 2(a) shows a period of time in which the toilet is used by the user, and does not represent a signal. The pulse signal from the waveform shaper 6 and a drive signal D for the light-emitting means 1 are ANDed by an AND gate 7, whose output signal is applied to a set terminal 8a of an R-S flip flop 8. These signals are ANDed by the AND gate 7 in order to remove noise which would otherwise be produced by extraneous light other than the light emitted by the light-emitting means 1. The output signal from the AND gate 7 is equivalent to the signal shown in FIG. 2(c).

The flip-flop 8 holds an output signal from its Q output terminal 8b at a high level during an interval of time, as shown in FIG. 2(e), after the light-detecting means 2 detects first light until it detects no light. The flip-flop 8 has a reset terminal 8c which is supplied with an output signal from an AND gate 10 which ANDs the drive signal D (FIG. 2(b)) for the light-emitting means 1 and a signal that is produced by inverting the output signal from the waveform shaper 6 with a NOT circuit 9. The signal applied to the reset terminal 8c is shown in FIG. 2(d).

To the Q output terminal of the flip-flop 8, there are connected a frequency divider 11 and a first counter 12. The frequency divider 11 and the first counter 12 are enabled when the output signal from the Q output terminal goes high.

In response to the detection of light by the light-detecting means 2, the frequency divider 11 frequency-divides the reference clock signal to immediately produce auxiliary drive pulses, as shown in FIG. 2(f). The first counter 12 produces a high-level output signal shown in FIG. 2(g) while it is counting a predetermined number (four in this embodiment) of output pulses from the frequency divider 11 in synchronism with the drive pulses (FIG. 2(b)). The output signal from the first counter 12 and the output signal from the frequency divider 11 are ANDed by an AND gate 14. The output signal from the AND gate 14, together with the output signal from the intermittent light-emitting pulse generator 5, is applied through an OR gate 15 to the light-emitting means 1.

The output signal from the AND gate 14 is a pulse signal of a short period, containing four pulses, as shown in FIG. 2(h). The frequency divider 11, the first counter 12, and the AND gate 14 jointly constitute an auxiliary light-emitting means.

A second counter 13 counts output pulses from the AND gate 10. Substantially at the same time that the user leaves the toilet, the second counter 13 counts output pulses (signal A shown in FIG. 2(d) produced by the AND gate 10, and applies a signal shown in FIG. 2(i) through an AND gate 19 to the faucet actuator circuit 17. The faucet actuator circuit 17 then actuates the faucet to supply water during a predetermined period of time shown in FIG. 2(k). Concurrent with this, the signal level of the Q output terminal of the flip-flop 8 goes low, disabling the frequency divider 11 and resetting the first counter 12. However, if the first counter 12 is producing a high-level output signal when the signal level of the Q output terminal of the flip-flop 8 goes low, that high-level output signal is rendered effective and produced as shown in FIG. 2(g). The first counter 12 is reset after the high-level output signal is produced. The other input terminal of the AND gate 19 is connected to an inhibit time setting circuit 18 which is started at the same time that it receives the signal from the Q output terminal of the flip-flop 8. The inhibit time setting circuit 18 continuously produces a low-level signal for a predetermined period of time after it receives the signal from the Q output terminal, and thereafter produces a high-level output signal (FIG. 2(j)). If an output signal is produced from the second counter 13 within a very short period of time after a user is detected, then the inhibit time setting circuit 18 regards such a condition as an erroneous detection and inhibits an output signal applied to the faucet actuator circuit 17.

The above arrangement can reliably and quickly detect the user leaving the toilet. Even when the light-detecting means 2 produces a signal corresponding to a detected signal under the influence of noise or the like, the faucet will not be actuated. Therefore, the water supply control system is highly reliable. The adverse effect of noise can be removed without lowering the detection sensitivity of the light-detecting means 2.

Figure 3:
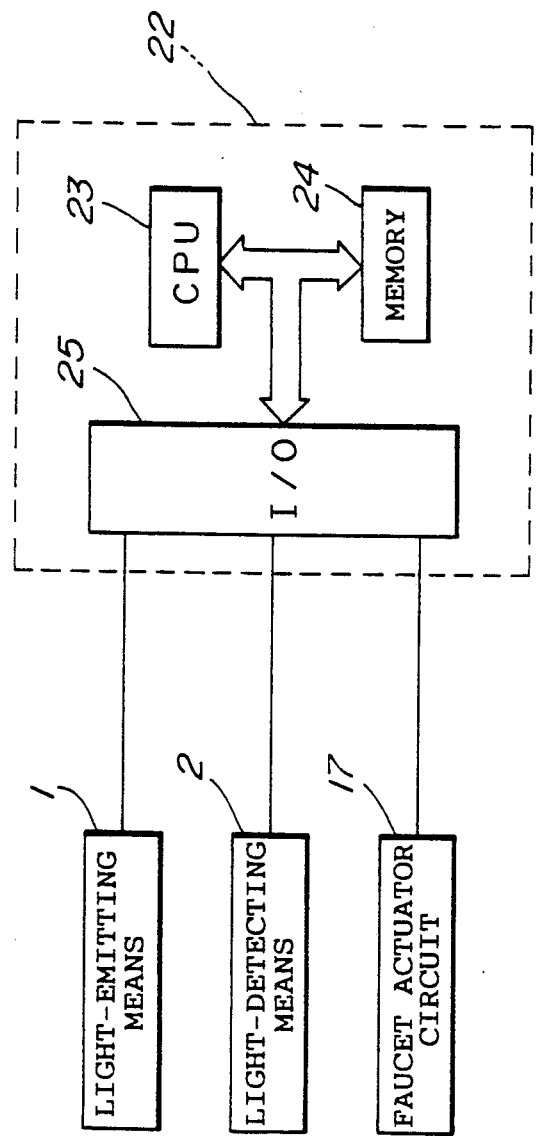
FIG. 3 is a block diagram of the circuit arrangement shown in FIG. 1 as it is implemented by a microcomputer.
Figure 4:
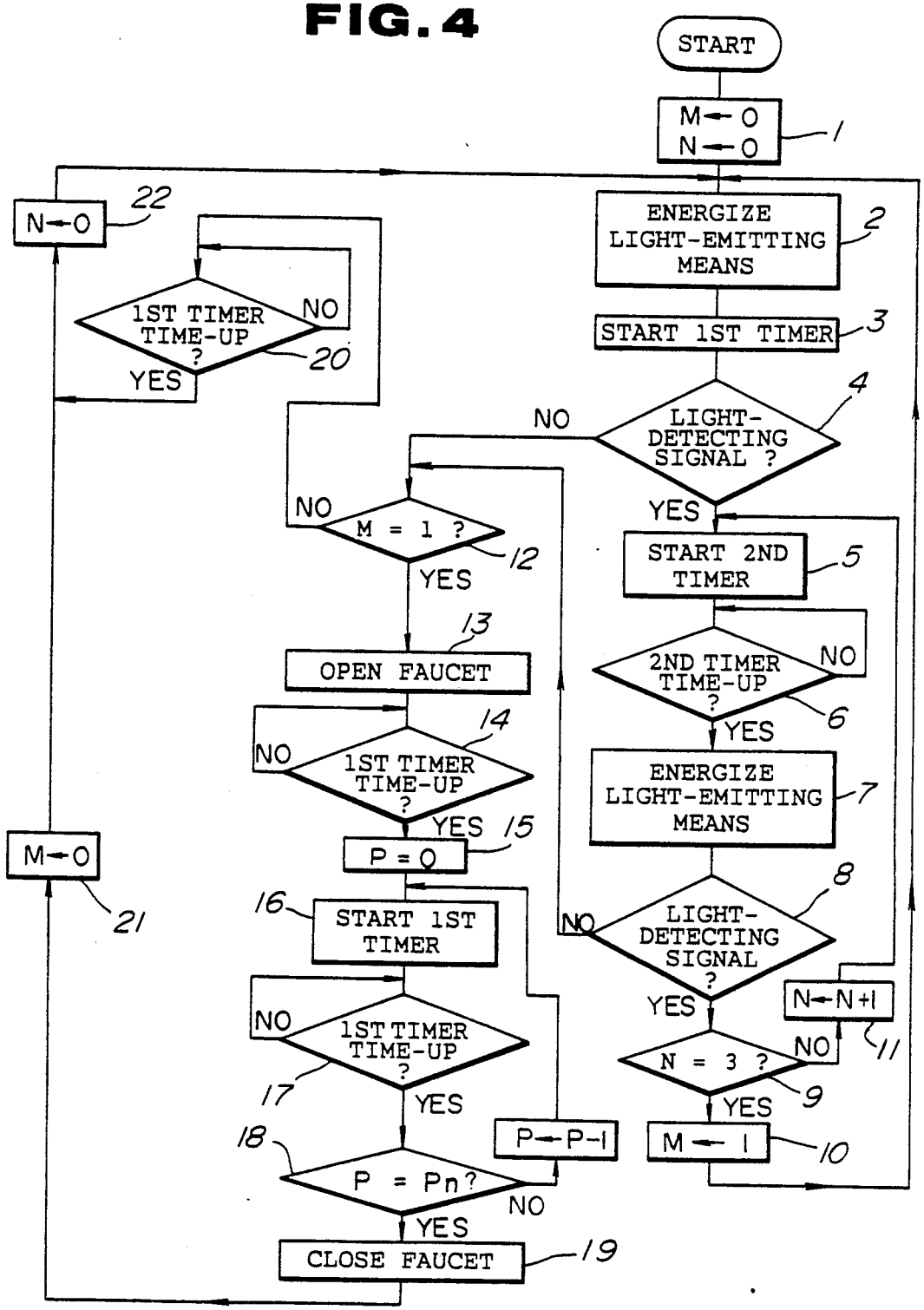
FIG. 4 is a flowchart of an operation sequence of a microcomputer which implements the circuit arrangement according to the first embodiment, as partly modified.

The circuit arrangement shown in FIG. 1 may be implemented by a microcomputer 22 having a CPU 23, a memory 24, an I/O 25, etc., as shown in FIG. 3. If such a microcomputer is employed for control, the water supply control system may not be limited to the above sequence, but may be controlled according to the flowchart shown in FIG. 4. The flowchart of FIG. 4 will now be described below.

Parameters M, N are initialized in a step 1. The parameter M is a parameter which indicates whether a user has already been detected or not, and the parameter N is a parameter which indicates the number of auxiliary drive pulses. The light-emitting means which is in a standby condition is energized for intermittent light emission in a step 2, and a first timer is started in a step 3, the first timer determining the period of the intermittent light emission. When light is detected in a step 4, steps 5 through 11 are executed for auxiliary light emission. A second timer which determines the period of auxiliary light emission is started in a step 5, and the time set by the second timer is measured in a step 6. The light-emitting means is energized for auxiliary light-emission in a step 7, which is followed by a step 8 that determines whether light is detected or not. If auxiliary light emission is detected by a predetermined number of times (e.g., four times) in a step 9, then the parameter M is set to 1, indicating that a user has been detected. If no light is detected in the step 4 or 8, then a step 12 determines whether a user has already been detected or not. If detected, then steps 13 through 19 are executed for the actuation of the faucet, and water is fed from the faucet for a predetermined period of time until a parameter P that determines a period of time in which to supply water represents a predetermined number Pn.

A water supply control system according to a second embodiment of the present invention will now be described with reference to FIGS. 5 through 8.

Figure 5:
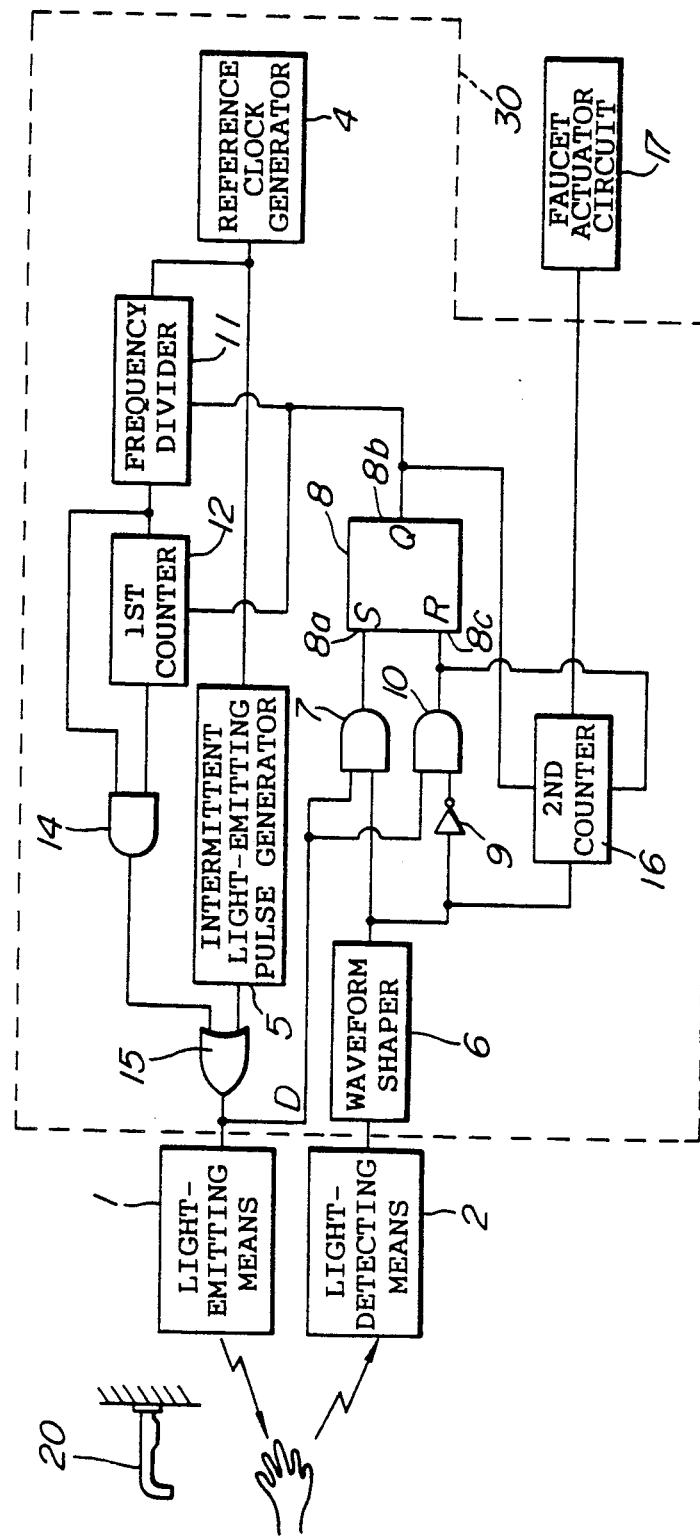
FIG. 5 is a block diagram of a circuit arrangement of a water supply control system according to a second embodiment of the present invention.
Figure 6:
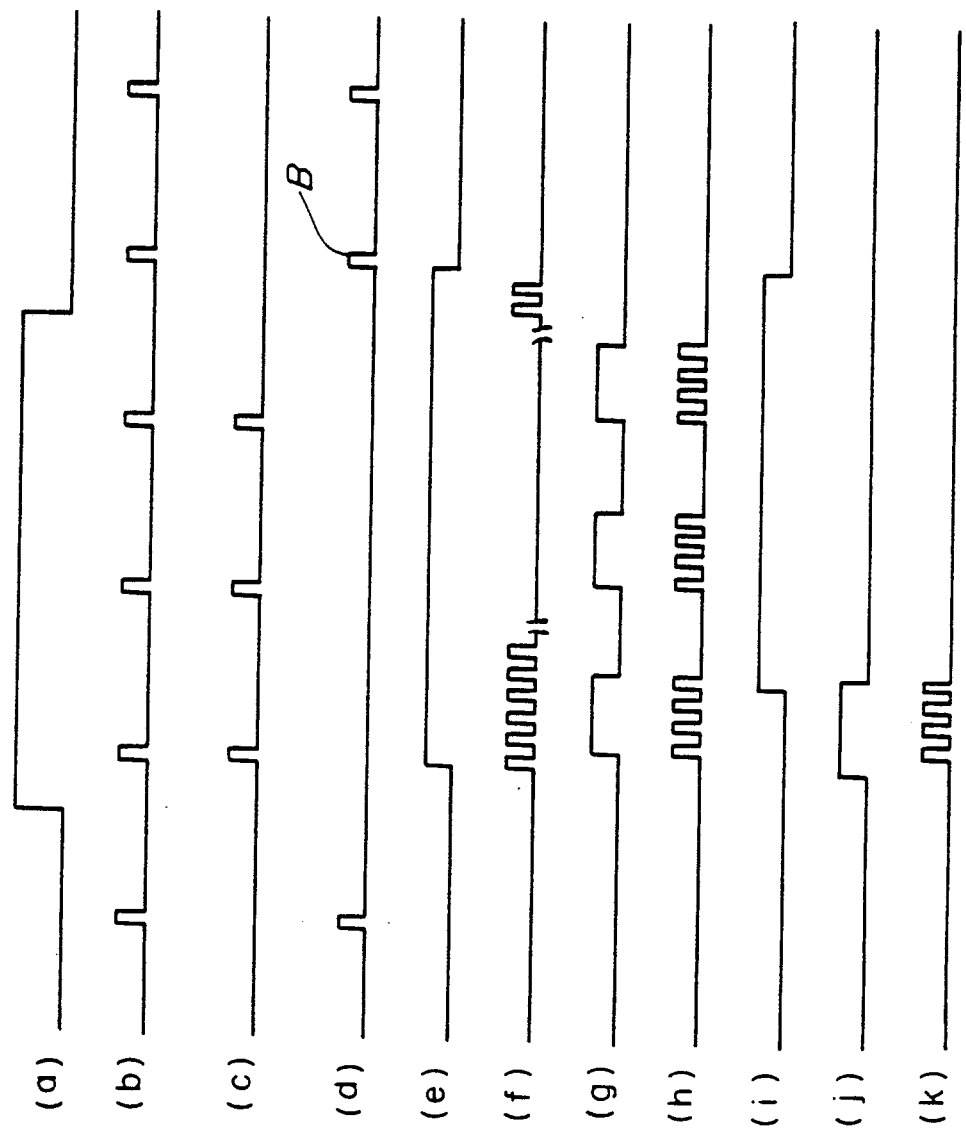
FIG. 6 is a timing chart of operation of the circuit arrangement shown in FIG. 5.

The water supply control system according to the second embodiment can mainly be incorporated in an automatic faucet device for a sink or the like which supplies water for a user to wash hands with. FIG. 5 shows a circuit arrangement of the water supply control system according to the second embodiment.

As shown in FIG. 5, the water supply control system comprises a light-emitting means 1 such as a photodiode or the like, a light-detecting means 2 such as a phototransistor or the like for detecting light emitted from the light-emitting means 1 and reflected by a portion of the body of a user, such as a hand of the user, a faucet actuator circuit 17 for actuating a faucet 20 to supply water for the user to wash hands with, and a control means 3. Therefore, the circuit arrangement shown in FIG. 5 is somewhat similar to the circuit arrangement according to the first embodiment shown in FIG. 1. Normally, the light-emitting means 1 is energized by an intermittent light-emitting pulse generator 5 which frequency-divides a clock signal produced by a reference clock generator 4 to generate pulses at suitable long periods. Output pulses or drive pulses of the intermittent light-emitting pulse generator 5 are shown in FIG. 6(b).

When a hand or the like of the user approaches the light-emitting means 1, a portion of the light from the light-emitting means 1 is reflected by the hand, and the light-emitting means 2 detects the reflected light and produces a detected signal. The detected signal is applied to a waveform shaper 6, which then produces a pulse signal shown in FIG. 6(c).

FIG. 6(a) shows a period of time in which the sink is used by the user, and does not represents a signal.

The pulse signal from the waveform shaper 6 and a drive signal D for the light-emitting means 1 are ANDed by an AND gate 7, whose output signal is applied to a set terminal 8a of an R-S flip-flop 8. These signals are ANDed by the AND gate 7 in order to remove noise which would otherwise be produced by extraneous light other than the light emitted by the light-emitting means 1. The output signal from the AND gate 7 is equivalent to the signal shown in FIG. 6(c).

The flip-flop 8 holds an output signal from its Q output terminal 8b at a high level during an interval of time, as shown in FIG. 6(e), after the light-detecting means 2 detects first light until it detects no light. The flip-flop 8 has a reset terminal 8c which is supplied with an output signal from an AND gate 10 which ANDs the drive signal D (FIG. 6(b)) for the light-emitting means 1 and a signal that is produced by inverting the output signal from the waveform shaper 6 with a NOT circuit 9. The signal applied to the reset terminal 8c is shown in FIG. 6(d).

To the Q output terminal of the flip-flop 8, there are connected a frequency divider 11, a first counter 12, and a second counter 16. The frequency divider 11, the first counter 12, and the second counter 16 are enabled when the output signal from the Q output terminal goes high.

In response to the detection of reflected light by the light-detecting means 2, the frequency divider 11 frequency-divides the reference clock signal to immediately produce auxiliary drive pulses, as shown in FIG. 6(f). The first counter 12 produces a high-level output signal shown in FIG. 6(g) while it si counting a predetermined number (four in this embodiment) of output pulses from the frequency divider 11 in synchronism with the drive pulses at long periods (FIG. 6(b)). The output signal from the first counter 12 and the output signal from the frequency divider 11 are ANDed by an AND gate 14. The output signal from the AND gate 14, together with the output signal from the intermittent light-emitting pulse generator 5, is applied through an OR gate 15 to the light-emitting means 1.

The output signal from the AND gate 14 is a pulse signal of a short period, containing four pulses, as shown in FIG. 6(h). The frequency divider 11, the first counter 12, and the AND gate 14 jointly constitute an auxiliary light-emitting means, as with the first embodiment.

The second counter 16 counts the number of times in which reflected light is detected by the light-detecting means 2 when the light-emitting means 1 is energized by the auxiliary light-emitting means. When the count of the second counter 16 reaches a prescribed number (e.g., four in this embodiment), the second counter 16 produces a high-level signal as shown in FIG. 6(i), and energizes the faucet actuator circuit 17 until it is reset by a pulse B in the signal shown in FIG. 6(d).

The faucet actuator circuit 17 then actuates a solenoid-operated valve (not shown) to enable a faucet 20 to supply water.

If the count of the second counter 16 does not reaches the prescribed number, then the faucet actuator circuit 17 is not energized. In this case, the second counter 16 counts a light-detecting signal due to a pulse which is produced by the auxiliary light-emitting means in response to a detected signal due to the light produced by a next drive pulse. When the count becomes 4, the faucet actuator circuit 17 is energized. If the light produced by a next drive pulse is not detected, the first and second counters are reset by the pulse signal shown in FIG. 6(d), and the water supply control system returns to a normal standby condition (waiting for a user). Therefore, the second counter 16 serves as a decision means in this embodiment.

With the above arrangement, even when the light-detecting means 2 produces a signal corresponding to a detected signal under the influence of noise or the like, the faucet will not be actuated. Therefore, the water supply control system is highly reliable. The adverse effect of noise can be removed without lowering the detection sensitivity of the light-detecting means 2.

If the frequency divider 11, the first counter 12, etc. are reset using the output signal (FIG. 6(i)) of the second counter 16, then the output signal shown in FIG. 6(g) becomes a signal shown in FIG. 6(j), and the output signals shown in FIGS. 6(f), (h) become a signal shown in FIG. 6(k).

The water supply control system according to the second embodiment should not be limited to the circuit arrangement shown in FIG. 5, but may be implemented by a microcomputer 22 having a CPU 23, a memory 24, an I/O 25, etc., as shown in FIG. 3. If such a microcomputer is employed for control, the water supply control system may be controlled according to the flowchart shown in FIG. 7 or 8.

The flowchart of FIG. 7 will now be described below. Parameters M, N are initialized in respective steps 1, 2. The parameter M is a parameter which indicates whether a faucet is open or not, and the parameter N is a parameter which indicates the number of auxiliary drive pulses.

The light-emitting means is energized in a step 3, and a first timer is started in a step 4, the first timer determining the long period of the drive pulses shown in FIG. 6(b). The time set by the first timer is measured in a step 15. If light is detected in a step 5, then steps 6 through 11 are executed in order to energize the auxiliary light-emitting means. A second timer serves to measure the short period of auxiliary drive pulses. After a predetermined number of auxiliary drive pulses have been detected in a step 10, the faucet is opened in a step 13 only when it is not opened in a step 12, and the parameter M is set to 1 in a step 14.

If no light is detected in the step 5 or 9, then a step 16 determines whether the faucet has been opened or not so far. If not opened (M=0), then control goes to the step 15. If opened (M=1), then the faucet is closed, and the parameter M is set to 0 for initialization, and the above process is repeated.

Figure 7:
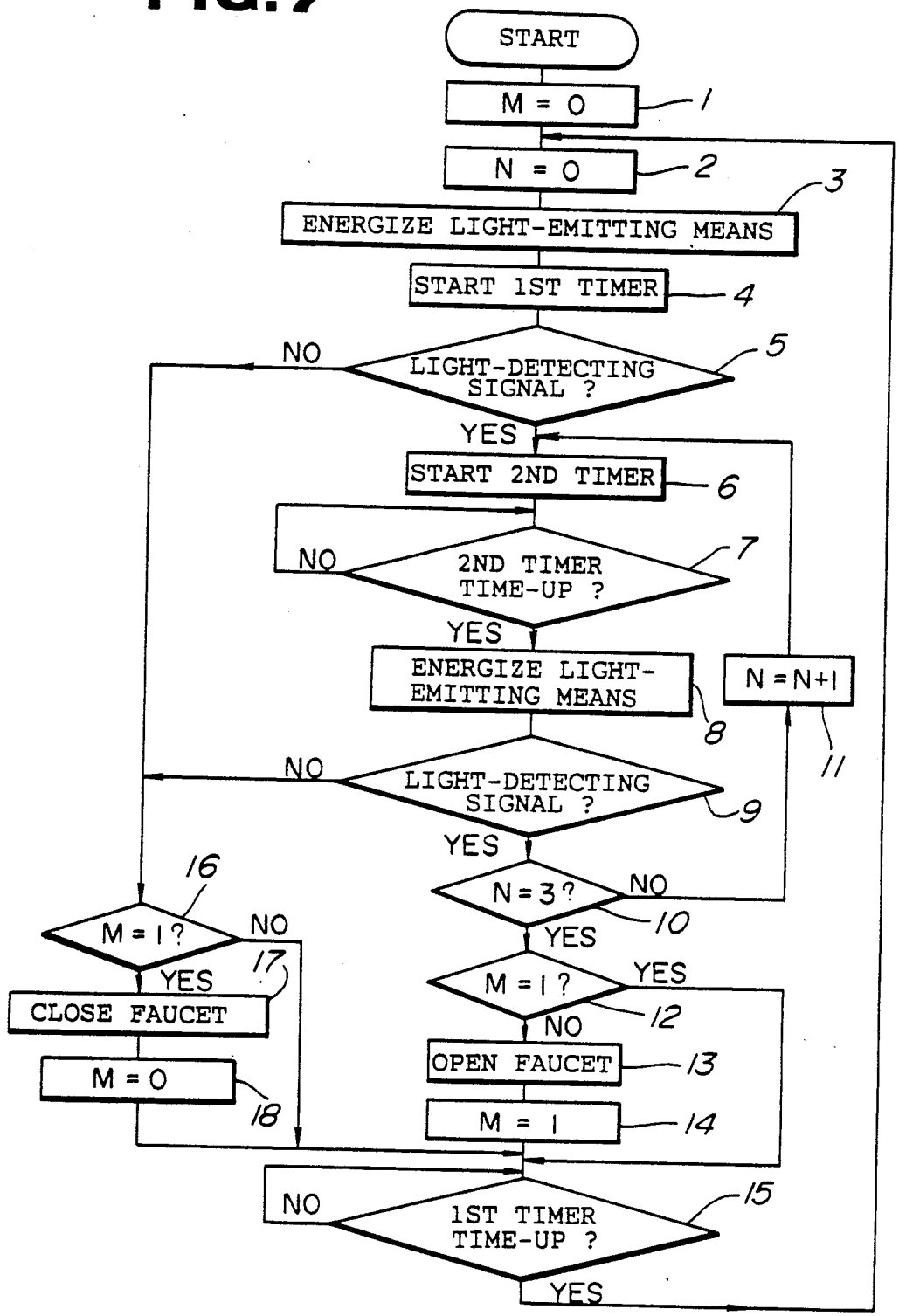
FIG. 7 is a flowchart of an operation sequence of a microcomputer which implements the circuit arrangement shown in FIG. 5.
Figure 8:
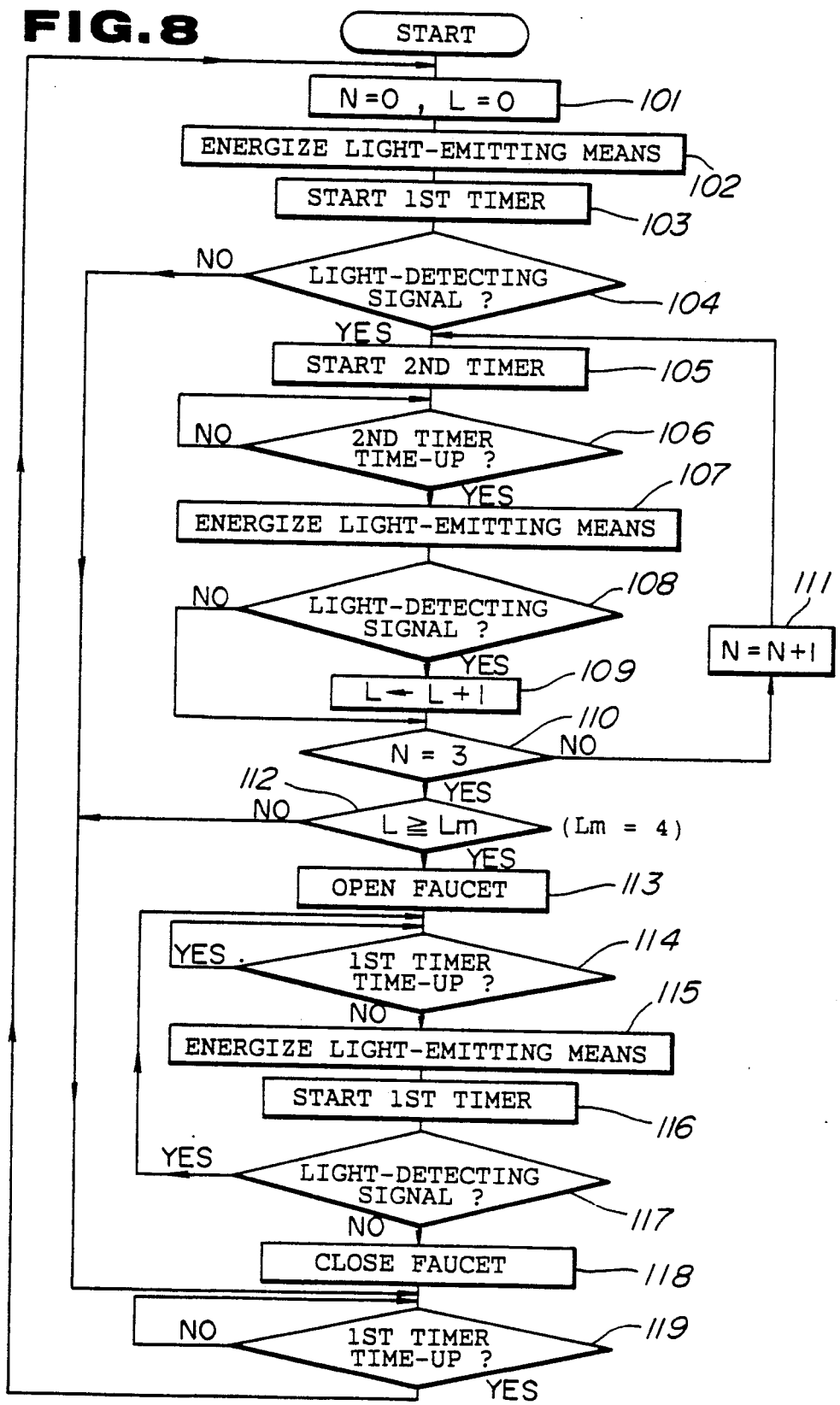
FIG. 8 is a flowchart of a different operation sequence of the microcomputer which implements the circuit arrangement shown in FIG. 5.

FIG. 8 shows a modified flowchart of an operation sequence which is similar to the operation sequence shown in FIG. 7. Details of the flowchart shown in FIG. 8 will not be described below. A parameter L in FIG. 8 represents the number of times in which light produced by an auxiliary light-emitting pulse is detected.

Figure 10:
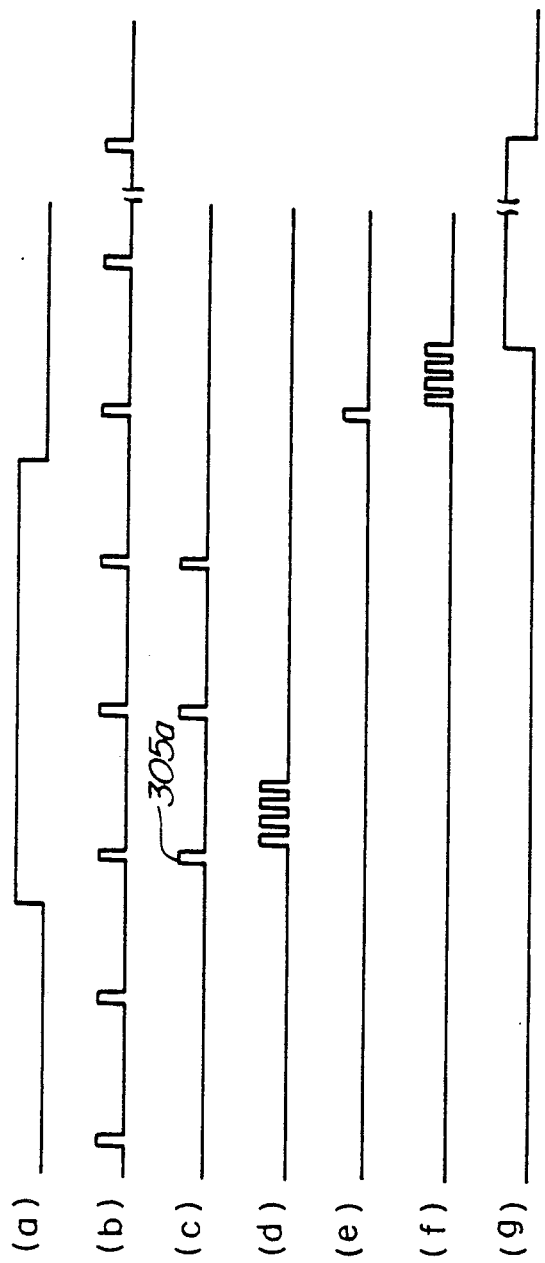
FIG. 10 is a timing chart of operation of the circuit arrangement shown in FIG. 9.
Figure 11:
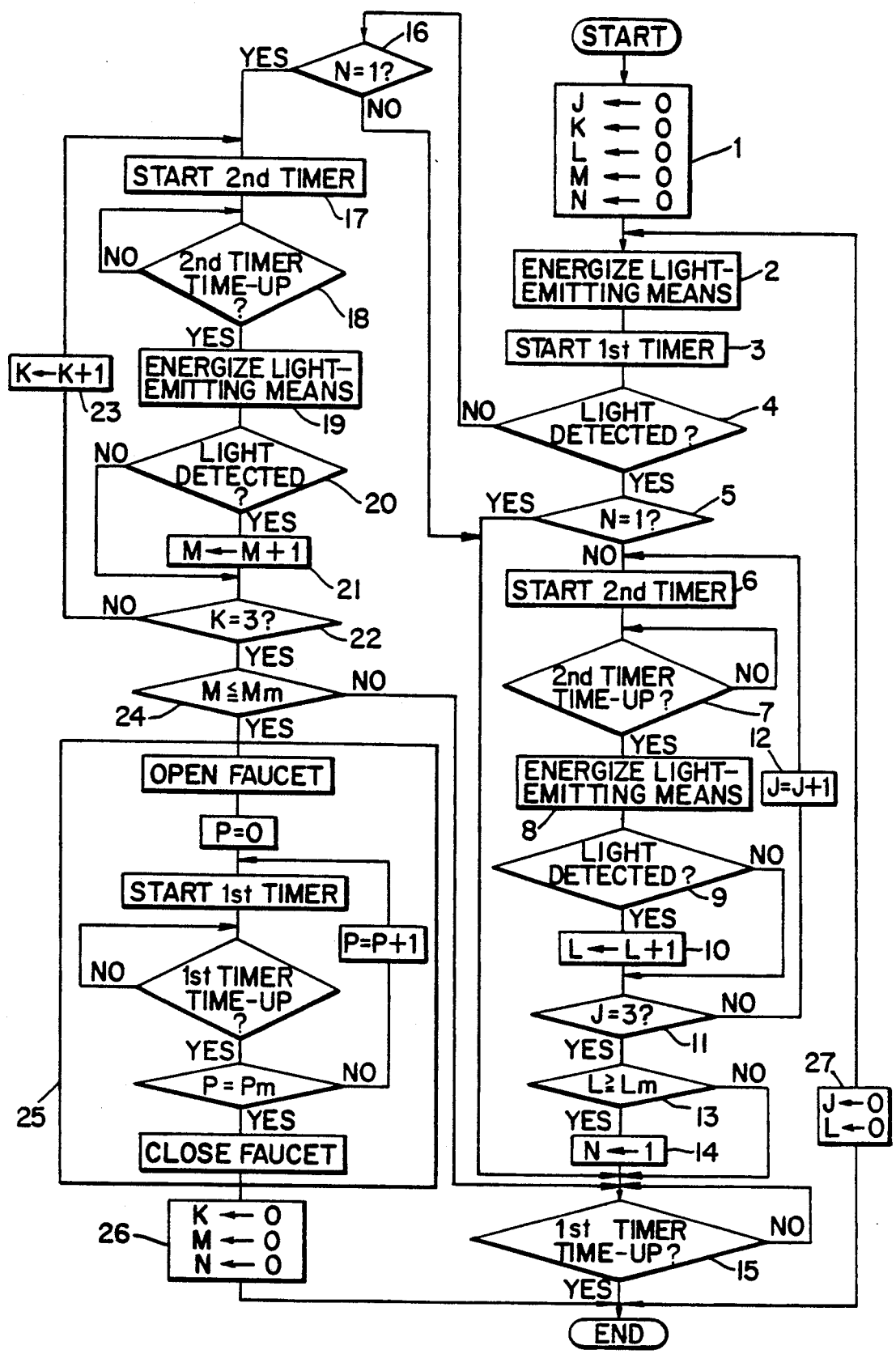
FIG. 11 is a flowchart of an operation sequence of a microcomputer which implements the circuit arrangement shown in FIG. 9.

A water supply control system according to a third embodiment of the present invention will now be described with reference to FIGS. 9 through 11.

The water supply control system according to the third embodiment can effectively be incorporated in an automatic flushing device for a toilet or the like in a bathroom.

Figure 9:
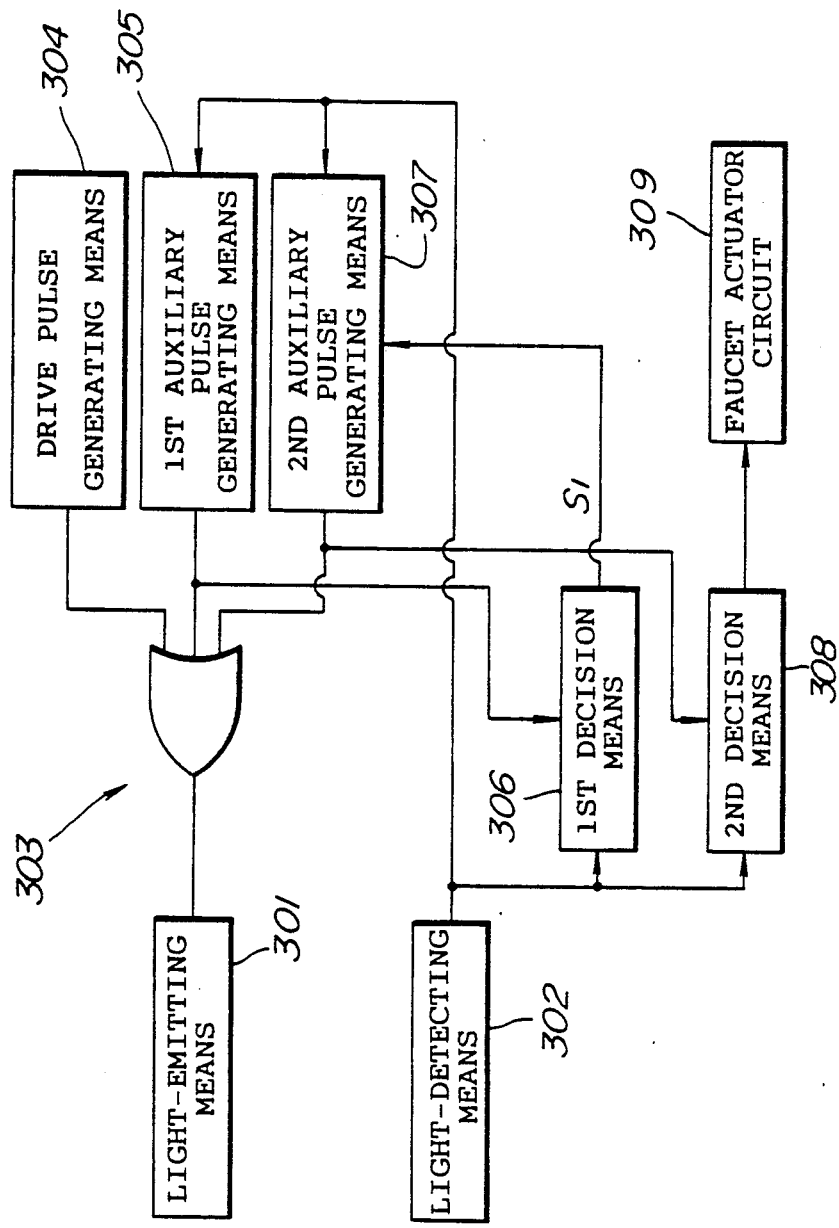
FIG. 9 is a block diagram of a circuit arrangement of a water supply control system according to a third embodiment of the present invention.

FIG. 9 shows a circuit arrangement of the water supply control system according to the third embodiment. The water supply control system comprises a light-emitting means 301 such as a photodiode or the like, a light-detecting means 302 such as a phototransistor or the like for detecting light emitted from the light-emitting means 1 and reflected by a portion of the body of a user, a faucet actuator circuit 309 for actuating a faucet (not shown) to supply water to a toilet or the like after the it has been used by a user, and a control means 303.

Normally or in a standby condition, a drive pulse generating means 304 in the control means 303 generates a periodic pulse signal shown in FIG. 10(b), which is supplied to the light-emitting means 301 to emit light. When a detected signal shown in FIG. 10(c) is produced by the light-detecting means 302, a first auxiliary pulse generating means 305 in the control means 303 generates a plurality of (e.g., four in this embodiment) of pulses (FIG. 10(d)) at a period shorter than the period of the drive pulses, based on a first pulse signal 305a. The generated pulses are applied to the light-emitting means 301 to emit light. In this embodiment, the first auxiliary pulse generating means 305 serves as a first auxiliary light-emitting means.

FIG. 10(a) does not represent a signal, but shows a period of time in which the user is in the vicinity of the light-emitting means 301 (e.g., a period of time in which the user uses the toilet).

A first decision means 306 in the control means 303 counts the number of times in which light is detected by the light-detecting means 302, among four light emissions of the first auxiliary pulse generating means 305. If the count is greater than a predetermined number (four in this embodiment), then the first decision means 306 determines that the detection by the light-detecting means 302 of reflected light produced by the drive pulses (FIG. 10(b)) is not caused by noise or the like, but by a user. The first decision means 306 now applies a decision signal S1 to a second auxiliary pulse generating means 307.

The second auxiliary pulse generating means 307 is brought into a standby condition by the output signal from the first decision means 306. After detecting the user based on both the drive pulses (FIG. 10(b)) and the output signal (FIG. 10(c)) from the light-detecting means 302, and responsive to a first pulse signal (FIG. 10(e)) when no user is detected, the second auxiliary pulse generating means 307 generates a plurality of (e.g., four in this embodiment) pulses at the same short period as the period of pulses from the first auxiliary pulse generating means 305. The generated pulses are applied to the light-emitting means 301 to emit light. The second auxiliary pulse generating means 307 serves as a second auxiliary light-emitting means.

A second decision means 308 in the control means 303 counts the number of times in which light is detected by the light-detecting means 302, among four light emissions of the second auxiliary pulse generating means 307. If the count is smaller than a predetermined number (e.g., zero in this embodiment), then the second decision means 308 determines that the user has left the toilet, and energizes the faucet actuator circuit 309 for a predetermined period of time as shown in FIG. 10(g) to flush the toilet, for example.

As with the first embodiment, the water supply control system according to the third embodiment may be implemented by a microcomputer 22 having a CPU 23, a memory 24, an I/O (input and output circuit) 25, etc., as shown in FIG. 3. If such a microcomputer is employed for control, the water supply control system may be controlled according to the flowchart shown in FIG. 11.

The flowchart of FIG. 11 will now be described below. Parameters J, K, L, M, N are initialized in a step 1. The parameter J is a parameter which indicates the number of times in which the first auxiliary pulse generating means 305 is energized, i.e., the number of pulses shown in FIG. 10(d)). The parameter K is a parameter which indicates the number of times in which the second auxiliary pulse generating means 307 is energized. The parameter L is a parameter which indicates the number of times in which reflected light that is emitted by the first auxiliary pulse generating means 305 is detected by the light-detecting means 302. The parameter M is a parameter which indicates the number of times in which light emitted by the second auxiliary pulse generating means 307 is detected by the light-detecting means 302. The parameter N is a parameter which indicates whether a user has already been detected or not.

The light-emitting means 301 is energized in a step 2, and a first timer is started in a step 3, the first timer determining the period of the drive pulses shown in FIG. 10(b). The time set by the first timer is measured in a step 15. If light is detected in a step 4, then it is determined in a step 5 whether a user has already been detected or not. If detected (N=1), then control goes to the step 15. If not detected (N=0), then steps 6 through 12 are executed to energize the first auxiliary pulse generating means 305. A second timer serves to determine the period of first auxiliary drive pulses. When the light emission due to four auxiliary pulses is completed in a step 11, a step 13 compares the number of times L in which light is detected by the light-detecting means 302 with a constant Lm (four in this embodiment). Only when the condition L ≧ Lm is met, it is regarded that a user is detected for the first time, and the parameter N is set to 1 in a step 14. If the above condition is not met, the light detected by the light-detecting means 302 is regarded as being caused by noise, and control goes to the step 15.

If no light is detected in the step 4, then a step 16 determines whether a user has been detected or not so far. If not detected, control goes to the step 15. If detected, then steps 17 through 23 are executed in order to energize the second auxiliary pulse generating means 307.

The second timer serves to determine a period for the generation of auxiliary pulses, as described above. When the light emission due to four auxiliary pulses is completed in a step 22, a step 24 compares the number of times M in which light is detected by the light-detecting means 302 with a constant Mm (zero in this embodiment). Only when the condition M ≦ Mm is met, it is regarded that the user has left, and the faucet is opened in a step 25. In the step 25, the first timer is started, and the number of times P in which the time set by the first timer is up or elapsed is compared with a constant Pm, until P = Pm. When the condition P = Pm is met, the faucet is closed. Then, the parameters K, M, N are initialized in a step 26. If the condition P = Pm is not met, it is determined that the user is still present, and control goes to the step 15. After elapse of a certain period of time, the parameters J, L are initialized in a step 27. Control then goes back to the step 2 to repeat the above process.

Figure 13:
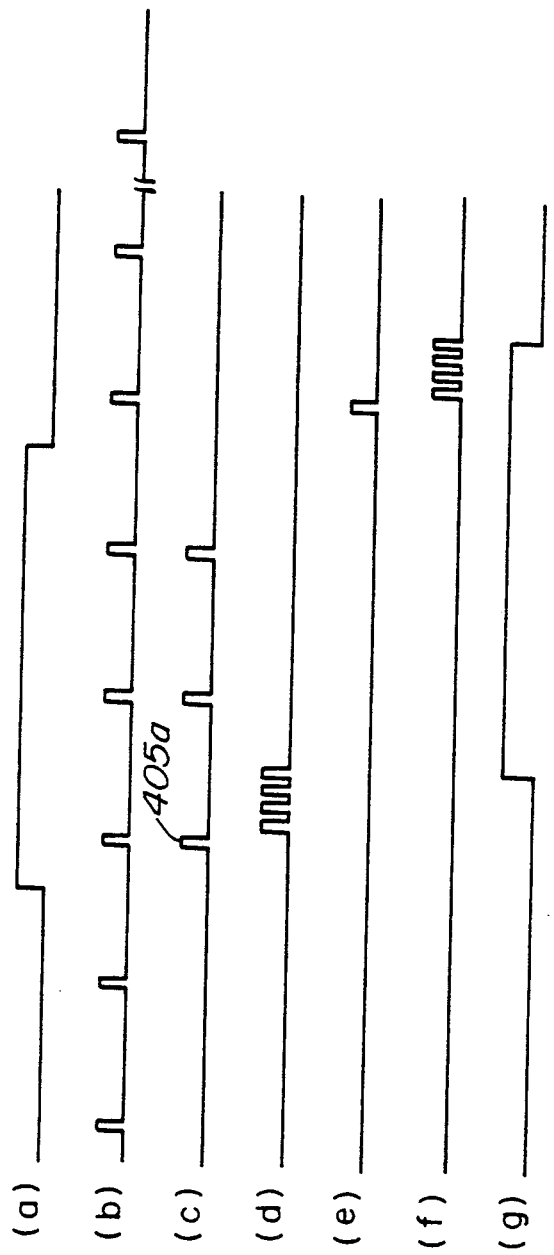
FIG. 13 is a timing chart of operation of the circuit arrangement shown in FIG. 12.
Figure 14:
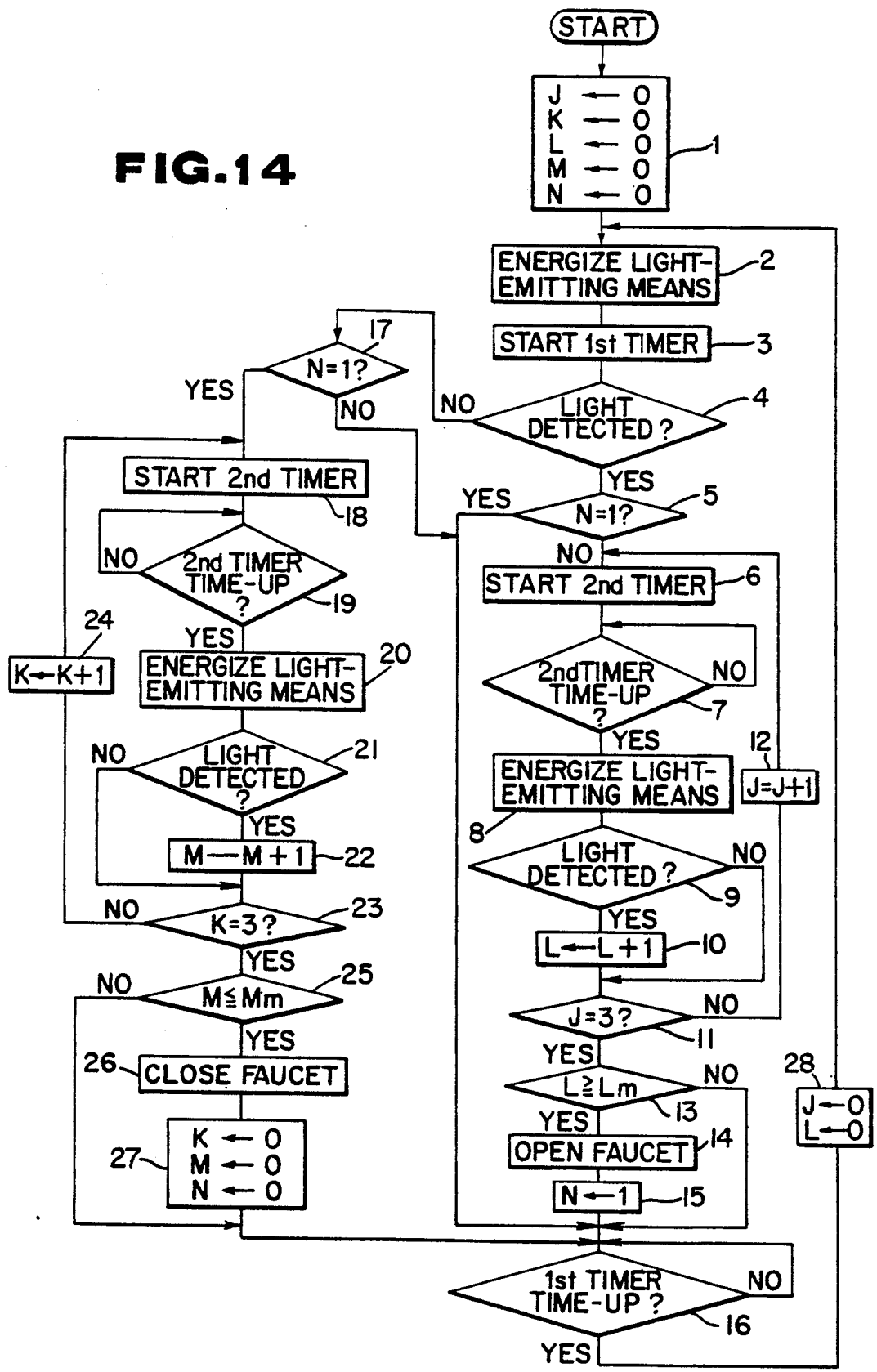
FIG. 14 is a flowchart of an operation sequence of a microcomputer which implements the circuit arrangement shown in FIG. 12.

A water supply control system according to a fourth embodiment of the present invention will now be described with reference to FIGS. 12 through 14. As with the water supply control system according to the second embodiment, the water supply control system according to the fourth embodiment can effectively be incorporated in an automatic faucet device for supplying washing water for users.

Figure 12:
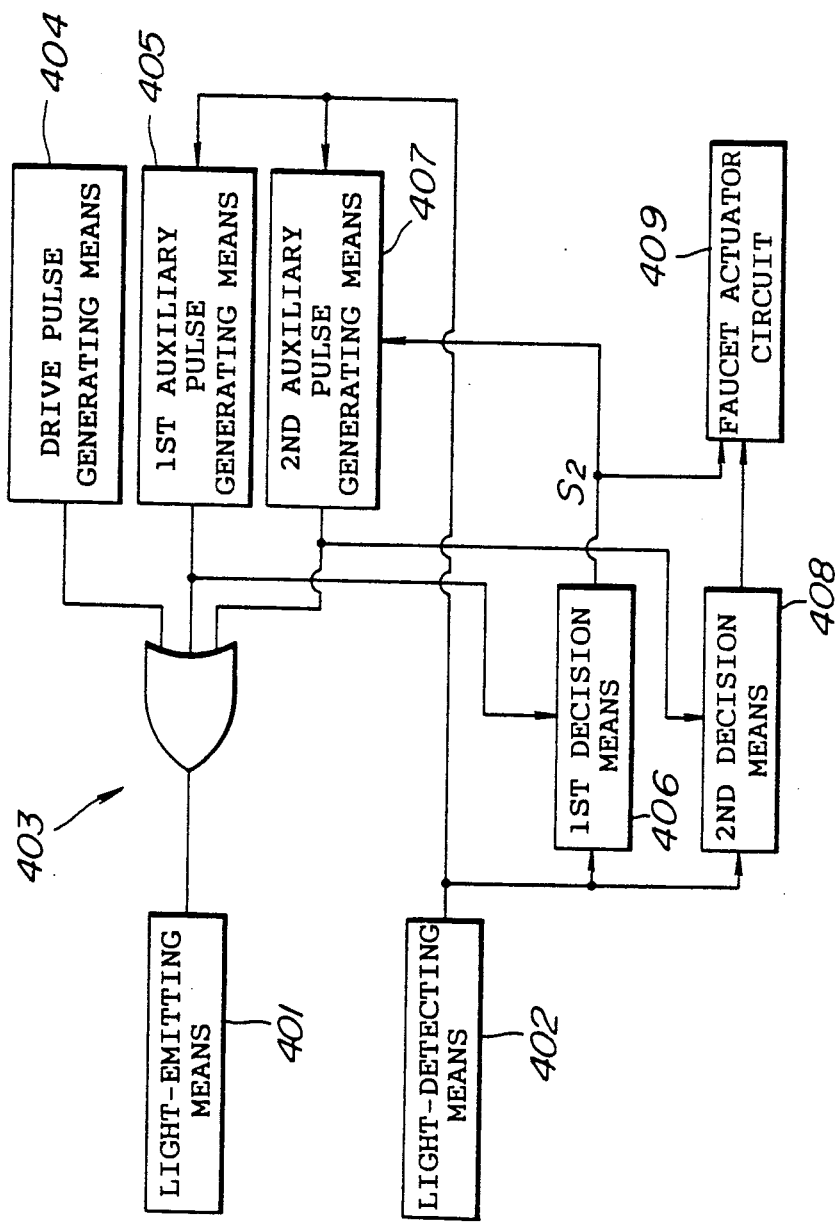
FIG. 12 is a block diagram of a circuit arrangement of a water supply control system according to a fourth embodiment of the present invention.

FIG. 12 shows a circuit arrangement of the water supply control system according to the fourth embodiment. The water supply control system comprises a light-emitting means 401 such as a photodiode or the like, a light-detecting means 402 such as a phototransistor or the like for detecting light emitted from the light-emitting means 1 and reflected by a portion of the body of a user, such as a hand or the like, a faucet actuator circuit 409 for actuating a faucet to supply washing water when a user has been detected, and a control means 403.

Normally or in a standby condition, a drive pulse generating means 404 in the control means 403 generates a periodic pulse signal shown in FIG. 13(b), which is applied to the light-emitting means 401 to emit light. When a detected signal shown in FIG. 13(c) is produced by the light-detecting means 402, a first auxiliary pulse generating means 405 in the control means 403 generates a plurality of (e.g., four in this embodiment) of pulses (FIG. 13(d)) at a period shorter than the period of the drive pulses, based on a first pulse signal 405a. The generated pulses are applied to the light-emitting means 401 to emit light. In this embodiment, the first auxiliary pulse generating means 405 serves as a first auxiliary light-emitting means.

FIG. 13(a) does not represent a signal, but shows a period of time in which the user's hand or the like is in the vicinity of the light-emitting means 401.

A first decision means 406 in the control means 403 counts the number of times in which light is detected by the light-detecting means 402, among four light emissions of the first auxiliary pulse generating means 405. If the count is greater than a predetermined number (four in this embodiment), then the first decision means 406 determines that the detection by the light-detecting means 402 of reflected light produced by the drive pulses (FIG. 13(b)) is not caused by noise or the like, but by a user. The first decision means 406 now applies a decision signal S2 to the faucet actuator circuit 409 which opens a faucet (not shown) to supply water, and also applies the decision signal S2 to a second auxiliary pulse generating means 407.

The second auxiliary pulse generating means 407 is brought into a standby condition by the output signal from the first decision means 406. After detecting the user based on both the drive pulses (FIG. 13(b)) and the output signal (FIG. 13(c)) from the light-detecting means 402, and responsive to a first pulse signal (FIG. 13(e)) when no user is detected, the second auxiliary pulse generating means 407 generates a plurality of (e.g., four in this embodiment) pulses at the same short period as the period of pulses from the first auxiliary pulse generating means 405. The generated pulses are applied to the light-emitting means 401 to emit light. The second auxiliary pulse generating means 407 serves as a second auxiliary light-emitting means.

A second decision means 408 in the control means 403 counts the number of times in which light is detected by the light-detecting means 402, among four light emissions of the second auxiliary pulse generating means 407. If the count is smaller than a predetermined number (e.g., zero in this embodiment), then the second decision means 408 determines that the user has left the faucet, and applies its decision signal to the faucet actuator circuit 409, thereby closing the faucet. FIG. 13(g) shows a period of time in which the faucet is opened by the faucet actuator circuit.

The water supply control system according to the fourth embodiment may be implemented by a microcomputer 22 having a CPU 23, a memory 24, an I/O (input and output circuit) 25, etc., as shown in FIG. 3. If such a microcomputer is employed for control, the water supply control system may be controlled according to the flowchart shown in FIG. 14.

The flowchart of FIG. 14 will now be described below. Parameters J, K, L, M, N are initialized in a step 1. The parameter J is a parameter which indicates the number of times in which the first auxiliary pulse generating means 405 is energized, i.e., the number of pulses shown in FIG. 13(d)). The parameter K is a parameter which indicates the number of times in which the second auxiliary pulse generating means 407 is energized. The parameter L is a parameter which indicates the number of times in which reflected light that is emitted by the first auxiliary pulse generating means 405 is detected by the light-detecting means 402. The parameter M is a parameter which indicates the number of times in which light emitted by the second auxiliary pulse generating means 707 is detected by the light-detecting means 402. The parameter N is a parameter which indicates whether a user has already been detected or not.

The light-emitting means 401 is energized in a step 2, and a first timer is started in a step 3, the first timer determining the period of the drive pulses shown in FIG. 13(b). The time set by the first timer is measured in a step 16. If light is detected in a step 4, then it is determined in a step 5 whether a user has already been detected or not. If detected (N=1), then control goes to the step 16. If not detected (N=0), then steps 6 through 12 are executed to energize the first auxiliary pulse generating means 405. A second timer serves to determine the period of first auxiliary drive pulses, and the time set by the second timer is measured in a step 7.

When the light emission due to four auxiliary pulses is completed in a step 11, a step 13 compares the number of times L in which light is detected by the light-detecting means 402 with a constant Lm (four in this embodiment). Only when the condition $L \geqq Lm$ is met, it is regarded that a user is detected for the first time, and the faucet is opened in a step 14, and the parameter N is set to 1 in a step 15. If the above condition is not met, the light detected by the light-detecting means 402 is regarded as being caused by noise, and control goes to the step 16.

If no light is detected in the step 4, then a step 17 determines whether a user has been detected or not so far. If not detected, control goes to the step 16. If detected, then steps 18 through 24 are executed in order to energize the second auxiliary pulse generating means 407.

The second timer serves to determine a period for the generation of auxiliary pulses, as described above. When the light emission due to four auxiliary pulses is completed in a step 23, a step 25 compares the number of times M in which light is detected by the light-detecting means 402 with a constant Mm (zero in this embodiment). Only when the condition $M \leqq Mm$ is met, it is regarded that the user has left, and the faucet is closed in a step 26. Then, the parameters K, M, N are initialized in a step 27. If the above condition is not met, it is determined that the user is still present, and control goes to the step 16. After elapse of a certain period of time, the parameters J, L are initialized in a step 28. Control then goes back to the step 2 to repeat the above process.

Industrial Applicability

With the present invention, as described above, the water supply control system has its detection sensitivity maintained, is prevented from malfunctioning due to noise, and is highly reliable. Since the light-emitting means is energized at high speed within a short period of time by the auxiliary light-emitting means in each of the above embodiments, the battery or the like is prevented from being unduly consumed. As described above in each of the embodiments, the water supply control system according to the present invention, which is capable of economizing water and electric power, may effectively be used with an automatic flushing device for a toilet or the like, or an automatic faucet device for a sink or the like.

What is claimed:

1. A water supply control system having light-emitting means for periodically emitting light, light-detecting means for detecting light emitted from the light-emitting means and reflected from a portion of the body of a user, and control means for controlling a faucet to supply water based on a detected signal from the light-detecting means, wherein said control means comprises auxiliary light-emitting means for enabling said light-emitting means to effect a plurality of light emissions at a period shorter than the period at which the light is periodically emitted thereby, when a user is detected on the basis of the detected signal from said light-detecting means, and decision means for counting the number of times in which the light is detected by said light-detecting means, among the light emissions caused by said auxiliary light-emitting means, and for controlling said faucet based on the counted number.

2. A water supply control system according to claim 1, for use with an automatic flushing device, wherein said decision means counts the number of times in which the light is detected by said light-detecting means, among the light emissions caused by said auxiliary light-emitting means, and opens said faucet when the counted number is equal to or smaller than a predetermined number.

3. A water supply control system according to claim 2, wherein said control means further includes disabling means, operable responsive to detection of the user based on the detected signal from said light-detecting means, for disabling said decision means unless a predetermined period time elapses from the detection of the user.

4. A water supply control system according to claim 1, for use with an automatic faucet device, wherein said decision means counts the number of times in which the light is detected by said light-detecting means, among the light emissions caused by said auxiliary light-emitting means, and opens said faucet when the counted number is equal to or greater than a predetermined number.

5. A water supply control system having light-emitting means for periodically emitting light, light-detecting means for detecting light emitted from the light-emitting means and reflected from a portion of the body of a user, and control means for controlling a faucet to supply water based on a detected signal from the light-detecting means, wherein said control means comprises auxiliary light-emitting means for enabling said light-emitting means to effect a plurality of light emissions at a period shorter than the period at which the light is periodically emitted thereby, after a user is detected on the basis of the detected signal from said light-detecting means and when said detected signal is eliminated, and decision means for counting the number of times in which the light is detected by said light-detecting means, among the light emissions caused by said auxiliary light-emitting means, and for controlling said faucet based on the counted number.

6. A water supply control system according to claim 5, for use with an automatic flushing device, wherein said decision means counts the number of times in which the light is detected by said light-detecting means, among the light emissions caused by said auxiliary light-emitting means, and opens said faucet when the counted number is equal to or smaller than a predetermined number.

7. A water supply control system according to claim 5, for use with an automatic faucet device, wherein said decision means counts the number of times in which the light is detected by said light-detecting means, among the light emissions caused by said auxiliary light-emitting means, and opens said faucet when the counted number is equal to or smaller than a predetermined number.

8. A water supply control system comprising:
faucet actuating means for actuating a water supply faucet to supply water;
light-emitting means for intermittently emitting light at least a first period;
light-detecting means for detecting light emitted from said light-emitting means and reflected by a portion of the body of a user of the faucet, and for producing a detected signal indicative of whether the light is detected or not; and
control means for controlling said faucet actuating means to actuate the faucet based on the detected signal from said light-detecting means;

said control means comprising auxiliary light-emitting means for enabling said light-emitting means to effect a plurality of light emissions at a second period shorter than said first period, based on the detected signal from said light-detecting means; and decision means for applying a control signal to said faucet actuating means to control the faucet based on the number of times in which the light is detected by said light-detecting means, among the light emissions caused by said auxiliary light-emitting means through said light-emitting means.

9. A water supply control system according to claim 8, wherein said auxiliary light-emitting means causes said light-emitting means to effect a plurality of light emissions at the second period when the detected signal from said light-detecting means indicates the presence of the user, and wherein said decision means counts the number of times in which the light is detected by said light-detecting means, and applies a faucet opening control signal to said faucet actuating means to open the faucet for a predetermined period of time if the counted number is equal to or smaller than a predetermined number.

10. A water supply control system according to claim 9, wherein said control means further includes inhibit time setting means for inhibiting operation of said decision means for a predetermined period of time after having received the detected signal which indicates the absence of the user from said light-detecting means.

11. A water supply control system according to claim 8, wherein said auxiliary light-emitting means causes said light-emitting means to effect a plurality of light emissions at the second period when the detected signal from said light-detecting means is inverted from a condition indicative of the presence of the user to a condition indicative of the absence of the user, and wherein said decision means counts the number of times in which the light is detected by said light-detecting means, and applies a faucet opening control signal to said faucet actuating means to open the faucet for a predetermined period of time if the counted number is equal to or smaller than a predetermined number.

12. A water supply control system according to claim 8, wherein said auxiliary light-emitting means causes said light-emitting means to effect a plurality of light emissions at the second period when the detected signal from said light-detecting means indicates the presence of the user, and wherein said decision means counts the number of times in which the light is detected by said light-detecting means, and applies a faucet opening control signal to said faucet actuating means to open the faucet if the counted number is equal to or greater than a predetermined number.

13. A water supply control system according to claim 12, wherein said decision means applies a faucet closing control signal to said faucet actuating means to close the faucet when the detected signal from said light-detecting means is inverted from a condition indicative of the presence of the user to a condition indicative of the absence of the user.

14. A water supply control system according to claim 12, wherein said auxiliary light-emitting means causes said light-emitting means to effect a plurality of light emissions at the second period when the detected signal from said light-detecting means is inverted from a condition indicative of the presence of the user to a condition indicative of the absence of the user, and wherein said decision means counts the number of times in which the light is detected by said light-detecting means, and applies a faucet closing control signal to said faucet actuating means to close the faucet if the counted number is equal to or smaller than predetermined number.

* * * * *